(12) United States Patent
Yang et al.

(10) Patent No.: US 9,065,027 B2
(45) Date of Patent: Jun. 23, 2015

(54) LIGHT EMITTING DIODE PACKAGE STRUCTURE

(71) Applicant: Lextar Electronics Corporation, Hsinchu (TW)

(72) Inventors: Li-Cheng Yang, Zhongli (TW); Yu-Chun Lee, Zhubei (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 13 days.

(21) Appl. No.: 14/149,051

(22) Filed: Jan. 7, 2014

(65) Prior Publication Data

US 2014/0361323 A1    Dec. 11, 2014

(30) Foreign Application Priority Data

Jun. 11, 2013 (TW) .............................. 102120746 A

(51) Int. Cl.
 *H01L 33/00* (2010.01)
 *H01L 33/58* (2010.01)
 *G02F 1/15* (2006.01)
 *H01L 33/50* (2010.01)
 *H01L 33/44* (2010.01)

(52) U.S. Cl.
 CPC *H01L 33/58* (2013.01); *G02F 1/15* (2013.01); *H01L 33/44* (2013.01); *H01L 33/50* (2013.01)

(58) Field of Classification Search
 CPC ......... H01L 33/58; H01L 33/44; H01L 33/50; G02F 1/15

USPC .............................................. 257/98, 99, 100
See application file for complete search history.

(56) References Cited

U.S. PATENT DOCUMENTS

| | | | |
|---|---|---|---|
| 2009/0140630 A1* | 6/2009 | Kijima et al. ................. | 313/498 |
| 2014/0151742 A1* | 6/2014 | Logunov et al. ............... | 257/99 |
| 2015/0049458 A1* | 2/2015 | Van Bommel et al. ......... | 362/84 |

FOREIGN PATENT DOCUMENTS

CN            201363664        12/2009

* cited by examiner

*Primary Examiner* — Victor A Mandala
(74) *Attorney, Agent, or Firm* — Moser Taboada

(57) ABSTRACT

A LED package structure includes a base portion, a light-emitting chip, a cup portion and an encapsulating glue. The base portion has an upper surface and a lower surface. The upper surface has a die-bonding area. The light-emitting chip emits a light with a first wavelength and is located on the die-bonding area. The cup portion is located on the base portion to surround the die-bonding area to form a recess having an opening. The encapsulating glue is filled into the recess. The encapsulating glue has a wavelength conversion material configured to convert part of the light with the first wavelength into a light with a second wavelength. The cup portion includes an electro chromic layer electrically connected to a first external power and a transmittance of the electro chromic layer is changed in accordance with an input voltage of the first external power to adjust the light-emitting profile of the light-emitting chip.

11 Claims, 7 Drawing Sheets

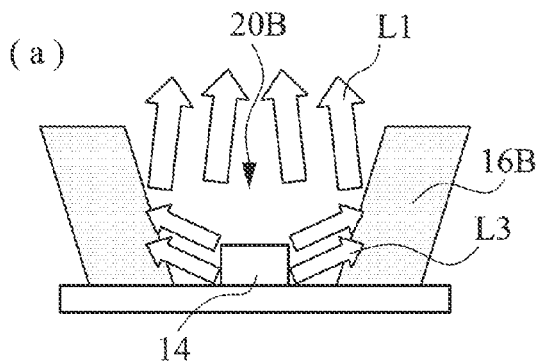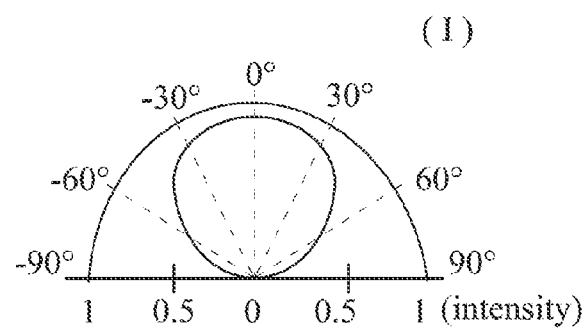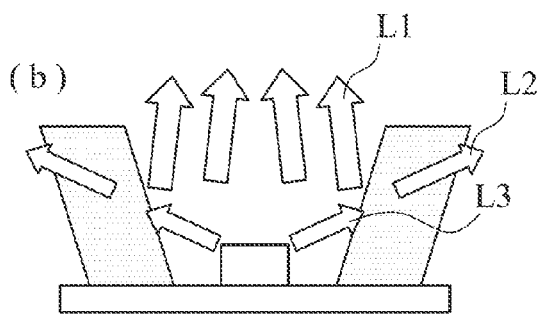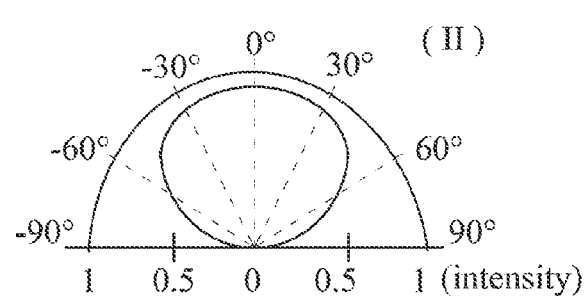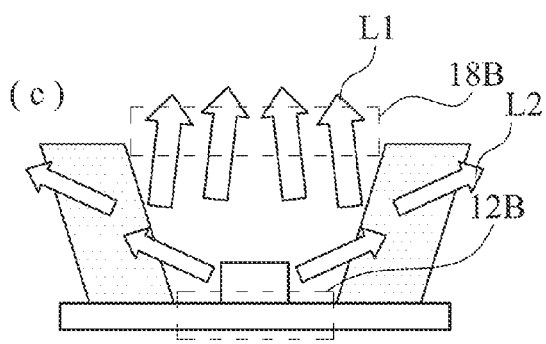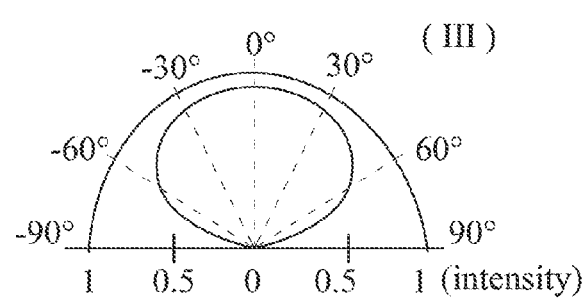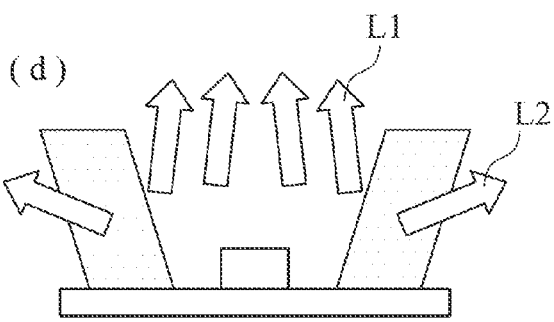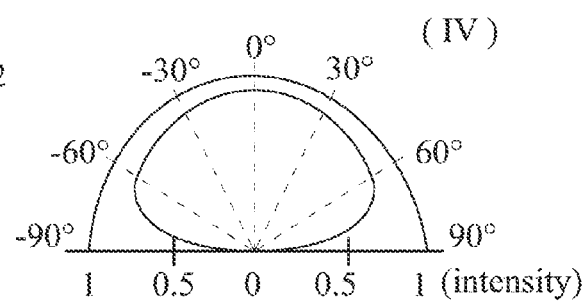
Fig. 6

LIGHT EMITTING DIODE PACKAGE STRUCTURE

RELATED APPLICATIONS

This application claims priority to Taiwan Application Ser. No. 102120746, filed Jun. 11, 2013, which is herein incorporated by reference.

BACKGROUND

1. Field of Invention

The present invention relates to a semiconductor device. More particularly, the present invention relates to a light emitting diode device.

2. Description of Related Art

In recent years, blue LEDs are very successful in mass production. LEDs are considerably increased in its application scope. With the LED production yield increase to reduce the manufacturing costs, the industry demand upon light-emitting diodes continues to increase. The LEDs with smaller size, long life, small power consumption and other characteristics, have been widely used in 3C products, such as indicator and display devices.

However, the light-emitting diode chip and its package have only a single light-emitting profile (e.g., light-emitting angle), the illumination scope is limited, thereby restricting its application field. For the forgoing reasons, there is a need for developing a new package structure for the light-emitting diode chip.

SUMMARY

It is therefore an objective of the present invention to provide a light emitting diode package structure with adjustable light-emitting profiles.

In accordance with the foregoing and other objectives of the present invention, a light emitting diode package structure with adjustable light-emitting profile includes a base portion, at least one light-emitting chip, a cup portion and an encapsulating glue. The base portion has an upper surface and a lower surface opposite to the upper surface. The upper surface has a die-bonding area. The at least one light-emitting chip emits a light with a first wavelength and is located on the die-bonding area. The cup portion is located on the base portion to surround the die-bonding area to form a recess having an opening above the die-bonding area. The encapsulating glue is filled into the recess. The encapsulating glue has a wavelength conversion material configured to convert part of the light with the first wavelength into a light with a second wavelength, and the light with the second wavelength mixed with the remaining light with the first light wavelength to form a white light. The cup portion includes an electro chromic layer electrically connected to a first external power and a transmittance of the electro chromic layer is changed in accordance with an input voltage of the first external power, so as to adjust the light profile of the light-emitting chip.

In another embodiment disclosed herein, when the voltage of the first external power is zero, the transmittance of the electro chromic layer is zero and the light emitted from the light-emitting chip only pass through the opening, and when the voltage of the first external power is greater than zero, the electro chromic layer is transformed into light transmissive and the light emitted from the light-emitting chip pass through the opening and the electro chromic layer.

In another embodiment disclosed herein, the electro chromic layer is a material selected from a group consisting of a transition metal oxide, a metal hexacyanoferrate, a heterocyclic conducting polymer, an organic bipyridylium and combinations thereof.

In another embodiment disclosed herein, the base portion includes a conductive portion electrically connected with a second external power.

In another embodiment disclosed herein, the light emitting diode package structure further includes an insulating layer having an opening to expose a predetermined area of the conductive portion within the die-bonding area.

In another embodiment disclosed herein, the conductive portion is a lead frame includes an electrode terminal protruding out from the base portion.

In another embodiment disclosed herein, the opening of the recess has an area smaller than the die-bonding area.

In another embodiment disclosed herein, the opening of the recess has an area greater than the die-bonding area.

In another embodiment disclosed herein, the opening of the recess has an area equal to the die-bonding area.

In another embodiment disclosed herein, the light-emitting chip is a blue light chip.

In another embodiment disclosed herein, the wavelength conversion material includes a phosphor powder, a pigment or dyestuff.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 6 illustrates a series of light-emitting profiles formed by an LED package structure with different applied voltages according to a second embodiment of this invention.

DETAILED DESCRIPTION

Figure 1:
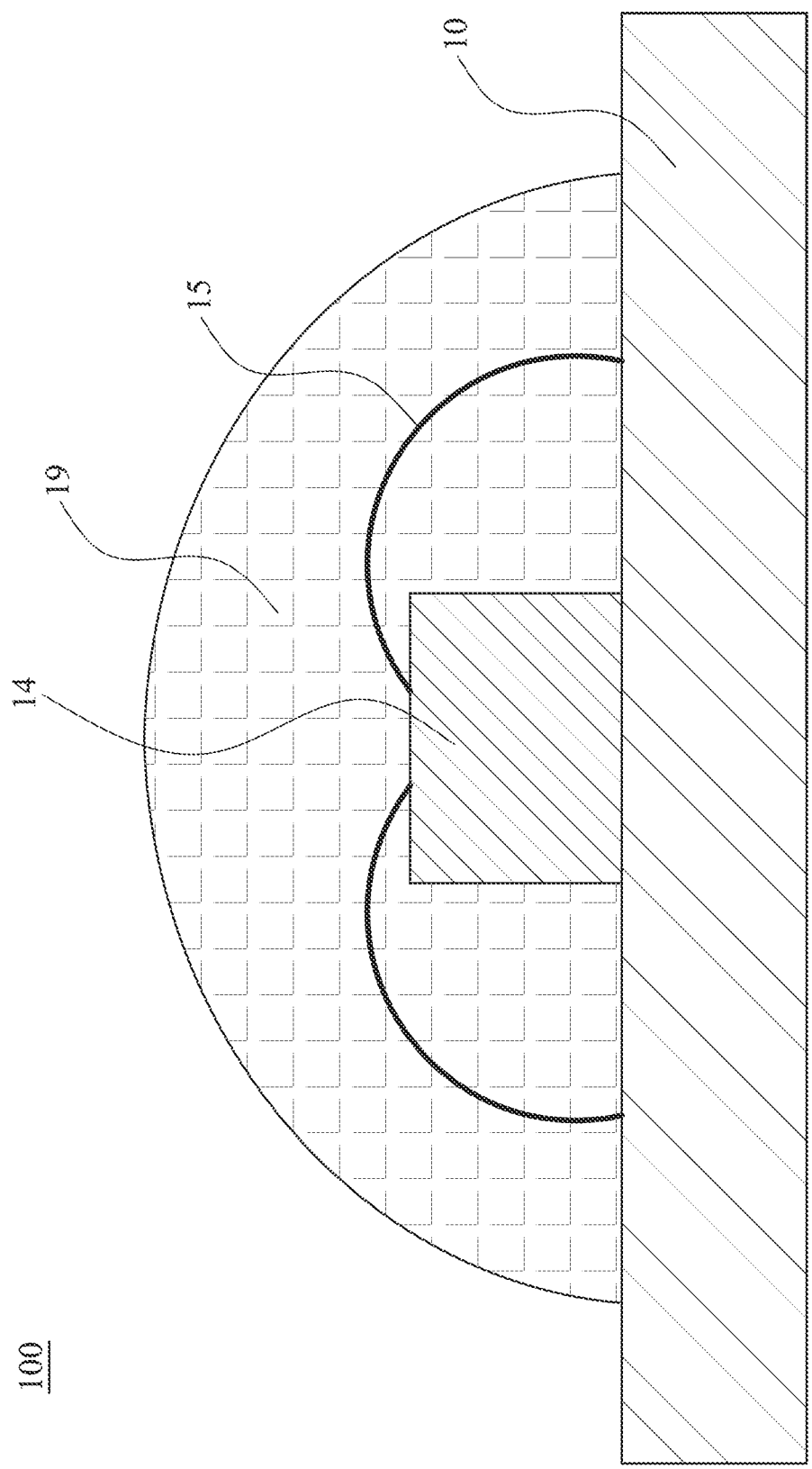
FIG. 1 illustrates a cross-sectional view of a conventional LED package structure.

Reference will now be made in detail to the present embodiments of the invention, examples of which are illustrated in the accompanying drawings. Wherever possible, the same reference numbers are used in the drawings and the description to refer to the same or like parts.

FIG. 1 illustrates a cross-sectional view of a conventional LED package structure. An LED package structure 100 includes a base portion 10. A light-emitting chip 14 is located on the base portion 10, and the light-emitting chip 14 is electrically connected to the base portion 10 via a gold wire 15, and an encapsulating glue 19 is finally formed to seal the light-emitting chip 14. However, the conventional LED package structure is equipped with only one light-emitting profile, thereby limiting its application environments.

Figure 2:
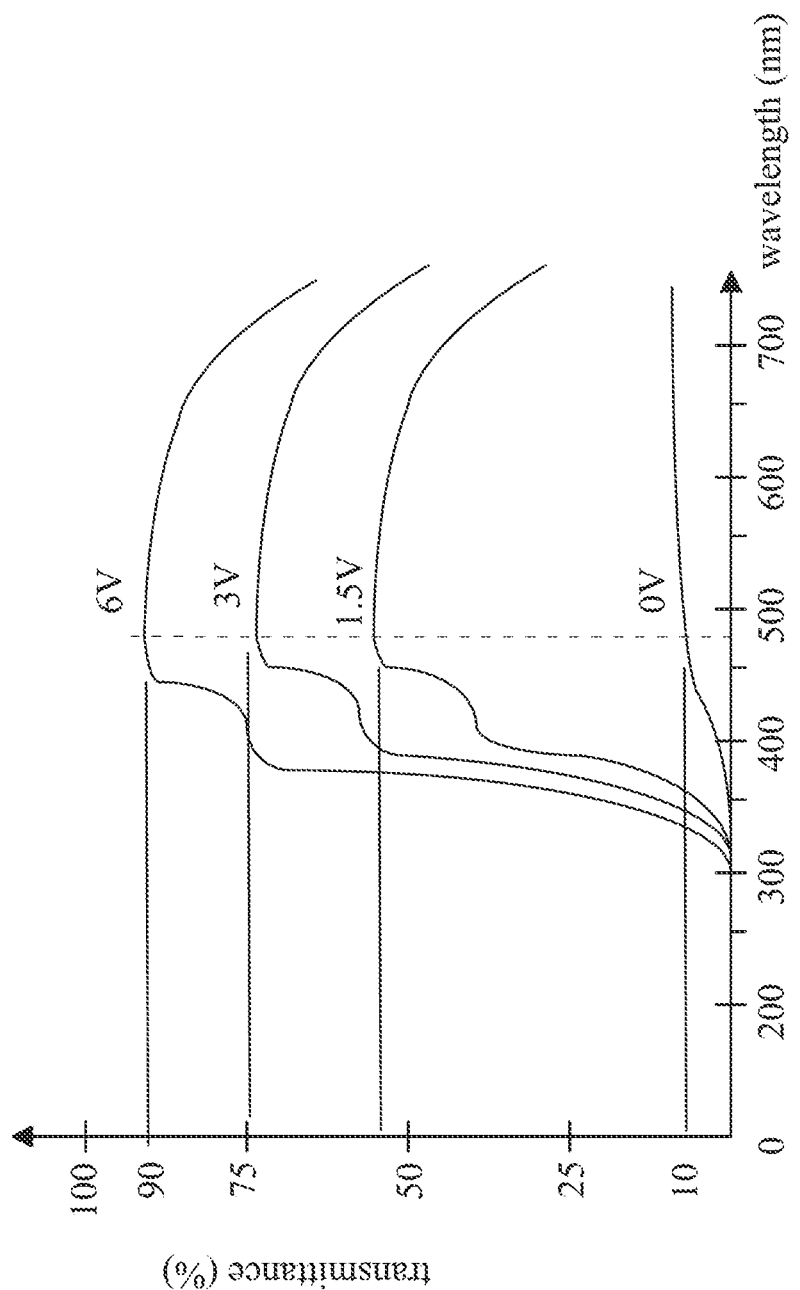
FIG. 2 is a relationship plot on the electro chromic material of applied voltage vs. light transmittance according to an embodiment of this invention.

FIG. 2 is a relationship plot on the electro chromic material of applied voltage vs. light transmittance according to an embodiment of this invention. An electro chromic material is a material upon which a voltage can be applied to adjust its light transmittance. In this embodiment, the electro chromic material is heterocyclic conducting polymer while the light-emitting chip 14 emits a light with wavelength 475 nm. When the electro chromic material is applied with a voltage "zero (V)", its light transmittance is about 10%, i.e., a lower transparency mode. When the electro chromic material is applied with a voltage greater than about 1.5 (V), its light transmittance is about 50%, i.e., a half transparency mode. When the electro chromic material is applied with a voltage greater than about 6 (V), its light transmittance is greater than 90%, i.e., a transparency mode. In accordance with the relationship plot on the electro chromic material of applied voltage vs. light transmittance in FIG. 2, the greater the voltage is applied (upon the electro chromic material), the greater the light transmittance of the electro chromic material is getting. Therefore, the LED package structure 200 could utilize its cup portion 16 equipped with an electro chromic material layer to adjust the light transmittance so as to vary the light-emitting profile based upon the light-emitting chip 14 with a light emitting consistency. Various embodiments are provided below.

Figure 3:
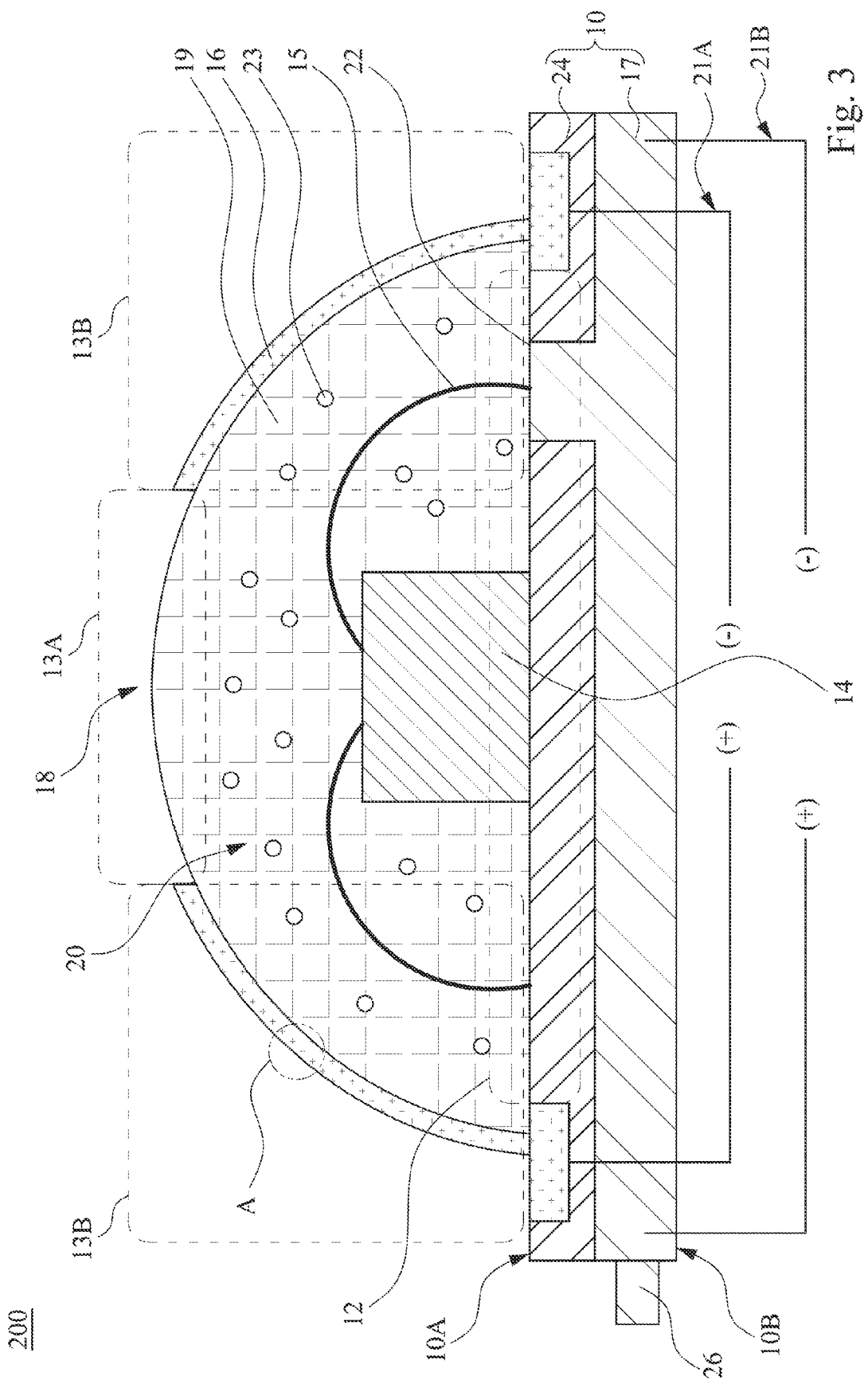
FIG. 3 illustrates a cross-sectional view of an LED package structure according to an embodiment of this invention.

FIG. 3 illustrates a cross-sectional view of an LED package structure according to an embodiment of this invention. An LED package structure 200 includes a base portion 10, a light-emitting chip 14, a cup portion 16 and an encapsulating glue 19. In particular, the base portion 10 includes an upper surface 10A and a lower surface 10B that is opposite to the upper surface 10A. The upper surface 10A is equipped with a die-bonding area 12 to secure the light-emitting chip 14. The light-emitting chip 14 is installed within the die-bonding area 12, and the light-emitting chip 14 emits a light with a first wavelength. The cup portion 16 is located on the upper surface 10A of the base portion 10 to surround the die-bonding area 12 to form a recess 20 with an opening 18 above the die-bonding area 12. In another embodiment, the encapsulating glue 19 may be filled into recess 20, and the encapsulating glue 19 may further include a wavelength conversion material 23 configured to convert part of the light with the first wavelength into a light with a second wavelength, and the light with the second wavelength is mixed with the remaining light with the first light wavelength to form a white light. In this embodiment, the cup portion 16 includes an electro chromic layer that is electrically connected to a first external power 21A and a transmittance of the electro chromic layer is changed in accordance with an input voltage of the first external power 21A, so as to adjust the light profile of the light-emitting chip 14. As illustrated in FIG. 3, the base portion 10 further includes a conductive portion 17 electrically connected with a second external power 21B so as to supply the light-emitting chip 14 with electricity. When the light-emitting chip 14 emits light, the light beams can be emitted via a first section 13A (i.e., the opening 18) and a second section 13B (i.e., the cup portion 16). A transmittance of the second section 13B can be adjusted to control a light emitting profile of the LED package structure.

The base portion 10 is equipped an insulating layer 24 (which is covered over the conductive portion 17) to insulate the conductive portion 17 that is electrically connected with a second external power 21B from the first external power 21A. When this LED package structure is implemented as a COB (Chip on Board) device, the insulating layer 24 has an opening 22 to expose a predetermined area of the conductive portion 17 within the die-bonding area 12. When this LED package structure is implemented as a lead frame package, the conductive portion 17 should be a lead frame, and the conductive portion 17 should further include an electrode terminal 26 protruding out from the base portion 10 to be connected with an external power.

Figure 4:
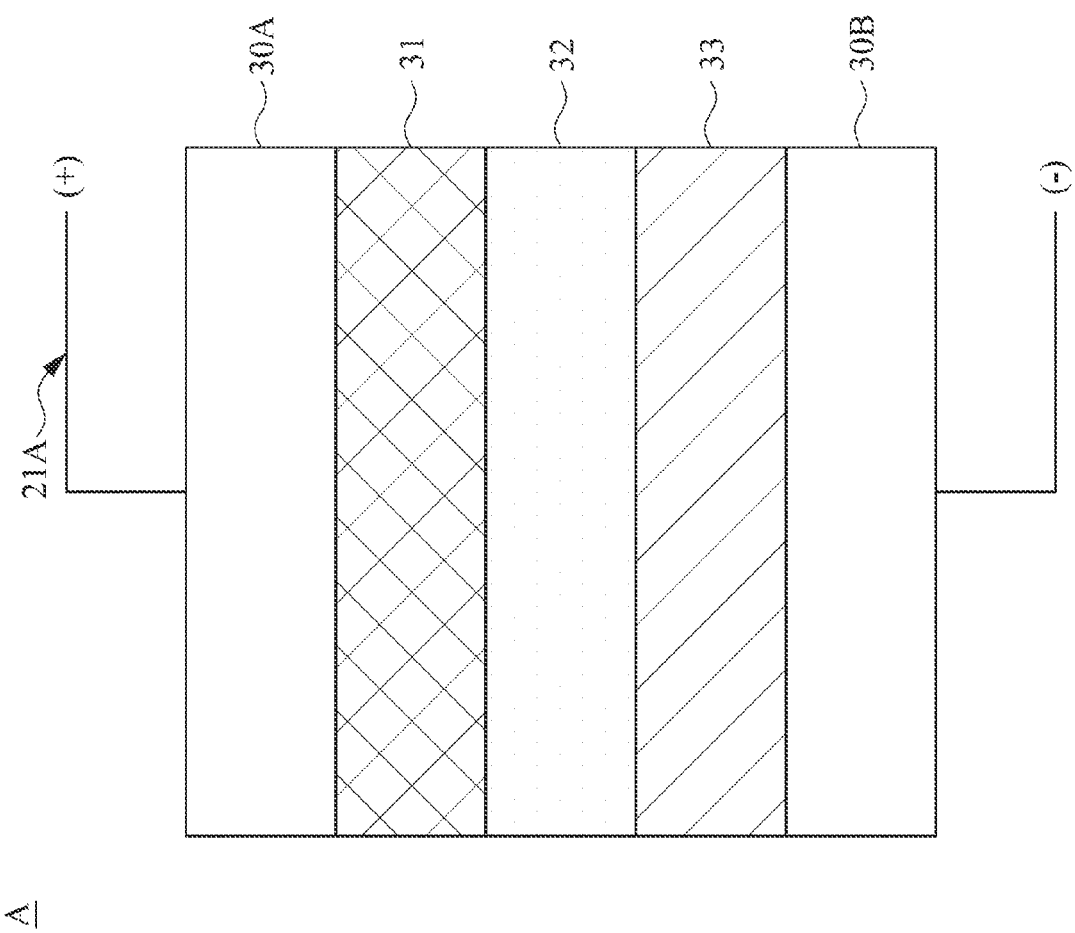
FIG. 4 illustrates an enlarged view of a section A in FIG. 3.

FIG. 4 illustrates an enlarged view of a section A in FIG. 3. The electro chromic structure includes transparent electrode layers 30A/30B, an ion storage layer 31, an electrolyte layer 32 and an electro chromic layer 33. The electrolyte layer 32 is sandwiched between the ion storage layer 31 and the electro chromic layer 33 while the transparent electrode layers 30A/30B are used to sandwich the ion storage layer 31, the electrolyte layer 32 and the electro chromic layer 33. An input voltage is applied to the ion storage layer 31 to release ions into the electrolyte layer 32 so as to adjust a transmittance of the electro chromic layer 33.

The electro chromic structure illustrated in FIG. 3 schematically shows one embodiment of the present invention, but is not used to limit the electro chromic structure of the present invention. It will be apparent to those skilled in the art that various modifications and variations can be made to the structure of the present invention without departing from the scope or spirit of the electro chromic structure illustrated in FIG. 3.

In addition, the word "connected" as used herein may refer to two or more elements are in direct physical or electrical contact with each other, or indirectly electrical contact, but also refer to two or more elements interoperate or interact with each other.

Figure 5:
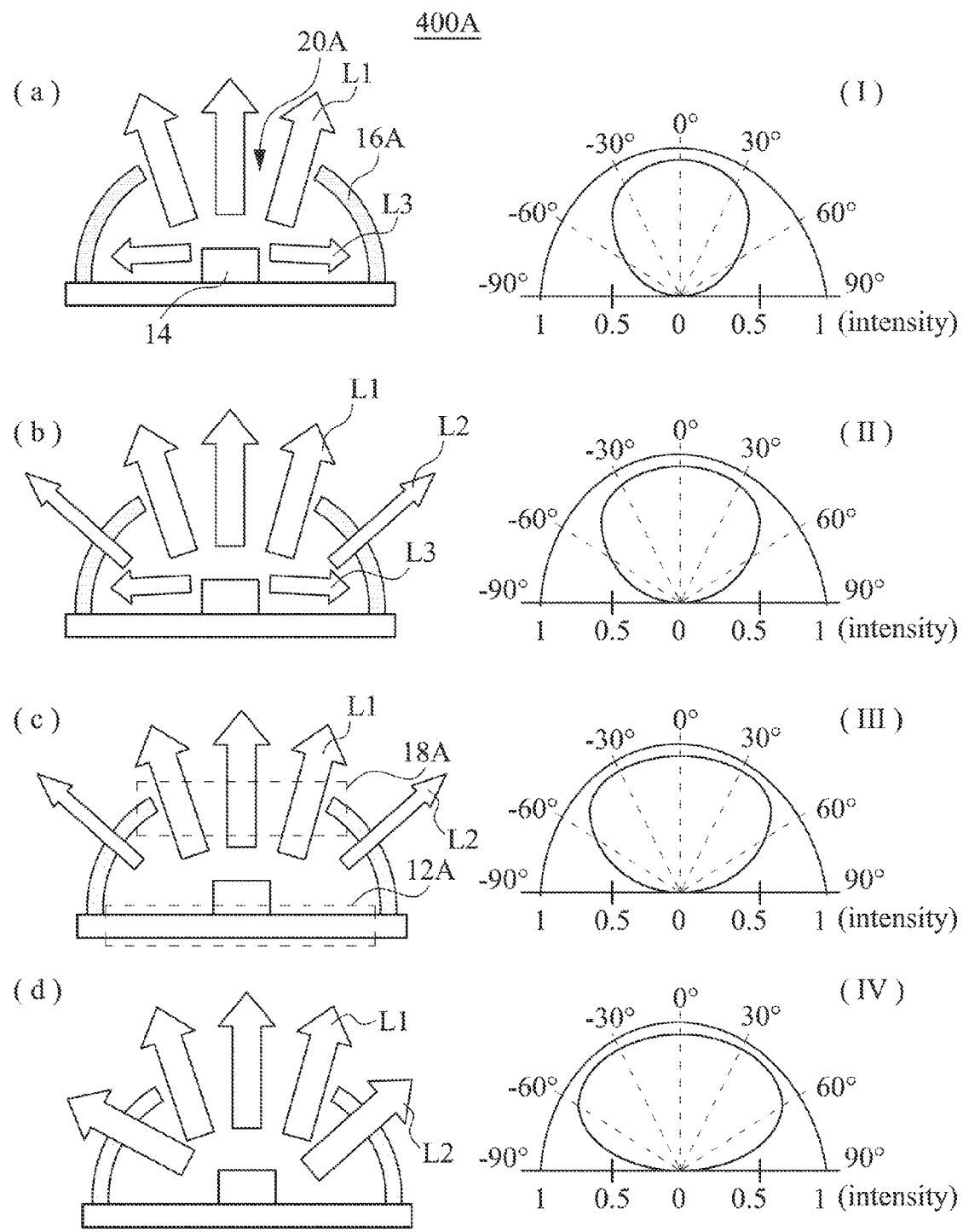
FIG. 5 illustrates a series of light-emitting profiles formed by an LED package structure with different applied voltages according to a first embodiment of this invention.
Figure 7:
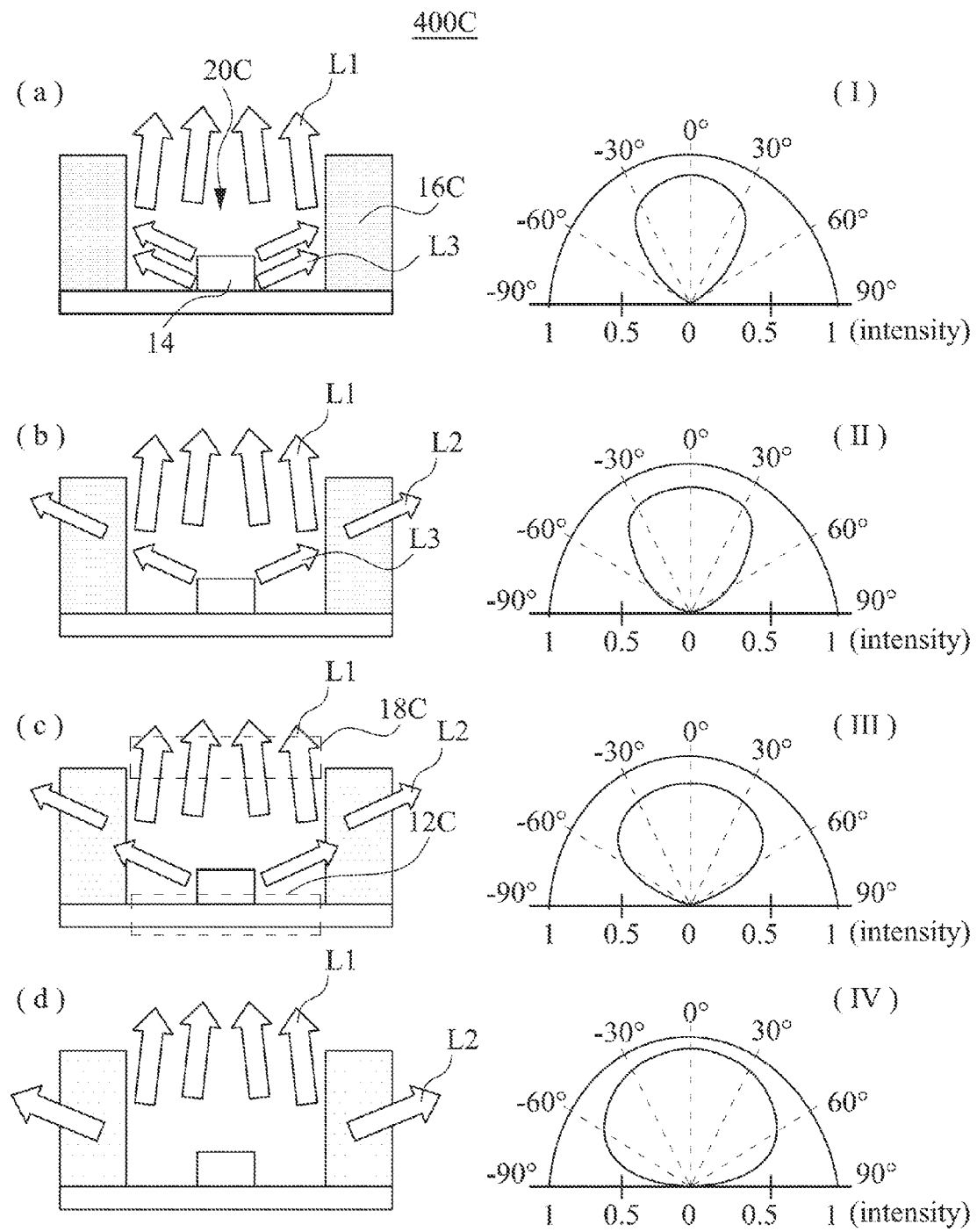
FIG. 7 illustrates a series of light-emitting profiles formed by an LED package structure with different applied voltages according to a third embodiment of this invention.

In order to easily understand the performance of the LED package structure 200, FIGS. 5-7 illustrate several types of packages.

FIG. 5 illustrates a series of light-emitting profiles formed by an LED package structure with different applied voltages according to a first embodiment of this invention. As illustrated in FIG. 5, an LED package structure 400A (a lens type package structure) is equipped with a cup portion 16A, which has a recess 20A above the die-bonding area 12A. The light-emitting chip 14 is installed within the recess 20A with its opening 18A smaller than the die-bonding area 12A, and the light is emitted and thus converged through the opening 18A. There are four operation modes (a)-(d) illustrated in FIG. 5, and their corresponding light-emitting profiles (I)-(IV) are also illustrated. Referring to FIG. 5-(*a*), when the electro chromic material is applied with a voltage "zero (V)", the light emitted from the light-emitting chip 14 partially goes in the direction L1 and partially goes in the direction L3. The light in the direction L3 is all blocked and reflected by the cup portion 16. Its light-emitting profile is illustrated in FIG. 5-(I). Referring to FIG. 5-(*b*), when the electro chromic material is applied with a voltage "1.5 (V) ", the light emitted from the light-emitting chip 14 partially goes in the direction L1, partially goes in the direction L2 and partially goes in the direction L3. The light in the direction L3 is all blocked and reflected by the cup portion 16. Its light-emitting profile is illustrated in FIG. 5-(II), which is widened from about +/−30° (as illustrated in FIG. 5-(I)) to about +/−60°. Referring to FIG. 5-(*c*), when the electro chromic material is applied with a voltage "3 (V)", the light emitted from the light-emitting chip 14 partially goes in the direction L1 and partially goes in the direction L2. Its light-emitting profile is illustrated in FIG. 5-(III), which is widened up to about +/−60°. Referring to FIG. 5-(*d*), when the electro chromic material is applied with a voltage "6 (V)", the light emitted from the light-emitting chip 14 partially goes in the direction L1 and partially goes in the direction L2. Its light-emitting profile is illustrated in FIG. 5-(IV), which is widened from about +/−30° (as illustrated in FIG. 5-(I)) up to beyond +/−60°.

FIG. 6 illustrates a series of light-emitting profiles formed by an LED package structure with different applied voltages according to a second embodiment of this invention. As illustrated in FIG. 6, an LED package structure 400B (reflective type package structure) is equipped with a cup portion 16B, which has a recess 20B above the die-bonding area 12B. The light-emitting chip 14 is installed within the recess 20B with its opening 18B greater than the die-bonding area 12B, and the light is emitted divergently through the opening 18B. There are four operation modes (a)-(d) illustrated in FIG. 6, and their corresponding light-emitting profiles (I)-(IV) are also illustrated. Referring to FIG. 6-(a), when the electro chromic material is applied with a voltage "zero (V)", the light emitted from the light-emitting chip 14 partially goes in the direction L1 and partially goes in the direction L3. The light in the direction L3 is all blocked and reflected by the cup portion 16. Its light-emitting profile is illustrated in FIG. 6-(I). Referring to FIG. 6-(b), when the electro chromic material is applied with a voltage "1.5 (V)", the light emitted from the light-emitting chip 14 partially goes in the direction L1, partially goes in the direction L2 and partially goes in the direction L3. The light in the direction L3 is all blocked and reflected by the cup portion 16. Its light-emitting profile is illustrated in FIG. 6-(II), which is widened from about +/−30° (as illustrated in FIG. 6-(I)) to about +/−60°. Referring to FIG. 6-(c), when the electro chromic material is applied with a voltage "3 (V)", the light emitted from the light-emitting chip 14 partially goes in the direction L1 and partially goes in the direction L2. Its light-emitting profile is illustrated in FIG. 6-(III), which is widened up to about +/−60°. Referring to FIG. 6-(d), when the electro chromic material is applied with a voltage "6 (V)", the light emitted from the light-emitting chip 14 partially goes in the direction L1 and partially goes in the direction L2. Its light-emitting profile is illustrated in FIG. 6-(IV), which is widened from about +/−30° (as illustrated in FIG. 6-(I)) up to beyond +/−60°.

FIG. 7 illustrates a series of light-emitting profiles formed by an LED package structure with different applied voltages according to a second embodiment of this invention. As illustrated in FIG. 7, an LED package structure 400C (flat plate type package structure) is equipped with a cup portion 16C, which has a recess 20C above the die-bonding area 12C. The light-emitting chip 14 is installed within the recess 20C with its opening 18C equal to the die-bonding area 12C, and the light is emitted upright through the opening 18C. There are four operation modes (a)-(d) illustrated in FIG. 7, and their corresponding light-emitting profiles (I)-(IV) are also illustrated. Referring to FIG. 7-(a), when the electro chromic material is applied with a voltage "zero (V)", the light emitted from the light-emitting chip 14 partially goes in the direction L1 and partially goes in the direction L3. The light in the direction L3 is all blocked and reflected by the cup portion 16. Its light-emitting profile is illustrated in FIG. 7-(I). Referring to FIG. 7-(b), when the electro chromic material is applied with a voltage "1.5 (V)", the light emitted from the light-emitting chip 14 partially goes in the direction L1, partially goes in the direction L2 and partially goes in the direction L3. The light in the direction L3 is all blocked and reflected by the cup portion 16. Its light-emitting profile is illustrated in FIG. 7-(II), which is widened from about +/−30° (as illustrated in FIG. 7-(I)) to about +/−60°. Referring to FIG. 7-(c), when the electro chromic material is applied with a voltage "3 (V)", the light emitted from the light-emitting chip 14 partially goes in the direction L1 and partially goes in the direction L2. Its light-emitting profile is illustrated in FIG. 7-(III), which is widened up to about +/−60°. Referring to FIG. 7-(d), when the electro chromic material is applied with a voltage "6 (V)", the light emitted from the light-emitting chip 14 partially goes in the direction L1 and partially goes in the direction L2. Its light-emitting profile is illustrated in FIG. 7-(IV), which is widened from about +/−30° (as illustrated in FIG. 7-(I)) up to beyond +/−60°.

As illustrated in FIGS. 5, 6 and 7, when the cup portions (16A, 16B, 16C) are applied with different voltages to adjust their transmittance, and partial light could emit through the cup portions (16A, 16B, 16C) so as to obtain wider light profiles, which is different from the light profile of the opaque cup portion.

In this embodiment, the electro chromic layer is a material selected from a group consisting of a transition metal oxide, a metal hexacyanoferrate, a heterocyclic conducting polymer, an organic bipyridylium and combinations thereof. The light-emitting chip is a blue light chip. The wavelength conversion material may include a phosphor powder, a pigment or dyestuff. Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode package structure with adjustable light-emitting profile comprising:
    a base portion having an upper surface and a lower surface opposite to the upper surface, the upper surface having a die-bonding area;
    at least one light-emitting chip emitting a light with a first wavelength and being disposed on the die-bonding area;
    a cup portion being disposed on the base portion and being disposed to surround the die-bonding area to form a recess having an opening above the die-bonding area; and
    an encapsulating glue being filled into the recess, the encapsulating glue having a wavelength conversion material configured to convert part of the light with the first wavelength into a light with a second wavelength, the light with the second wavelength mixed with the remaining light with the first light wavelength to form a white light;
    wherein the cup portion comprises an electro chromic layer electrically connected to a first external power and a transmittance of the electro chromic layer is changed in accordance with an input voltage of the first external power, so as to adjust the light profile of the light-emitting chip.

2. The light emitting diode package structure of claim 1, wherein when the voltage of the first external power is zero, the transmittance of the electro chromic layer is zero and the light emitted from the light-emitting chip only pass through the opening, and when the voltage of the first external power is greater than zero, the electro chromic layer is transformed into light transmissive and the light emitted from the light-emitting chip pass through the opening and the electro chromic layer.

3. The light emitting diode package structure of claim 1, wherein the electro chromic layer is a material selected from a group consisting of a transition metal oxide, a metal hexacyanoferrate, a heterocyclic conducting polymer, an organic bipyridylium and combinations thereof.

4. The light emitting diode package structure of claim 1, wherein the base portion comprises a conductive portion electrically connected with a second external power.

5. The light emitting diode package structure of claim 4 further comprising an insulating layer having an opening to expose a predetermined area of the conductive portion within the die-bonding area.

6. The light emitting diode package structure of claim 4, wherein the conductive portion is a lead frame comprising an electrode terminal protruding out from the base portion.

7. The light emitting diode package structure of claim 1, wherein the opening of the recess has an area smaller than the die-bonding area.

8. The light emitting diode package structure of claim 1, wherein the opening of the recess has an area greater than the die-bonding area.

9. The light emitting diode package structure of claim 1, wherein the opening of the recess has an area equal to the die-bonding area.

10. The light emitting diode package structure of claim 1, wherein the light-emitting chip is a blue light chip.

11. The light emitting diode package structure of claim 10, wherein the wavelength conversion material comprises a phosphor powder, a pigment or dyestuff.

\* \* \* \* \*